US007428173B2

(12) United States Patent
Forbes

(10) Patent No.: US 7,428,173 B2
(45) Date of Patent: *Sep. 23, 2008

(54) LOW POWER NROM MEMORY DEVICES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 5 days.

This patent is subject to a terminal disclaimer.

(21) Appl. No.: 11/707,213

(22) Filed: Feb. 13, 2007

(65) Prior Publication Data

US 2007/0147134 A1    Jun. 28, 2007

Related U.S. Application Data

(63) Continuation of application No. 11/151,952, filed on Jun. 14, 2005, now Pat. No. 7,200,046.

(51) Int. Cl.
    *G11C 16/00*    (2006.01)
(52) U.S. Cl. ............... 365/185.28; 365/185.18; 365/185.27
(58) Field of Classification Search ............. 365/185.05
    See application file for complete search history.

(56) References Cited

U.S. PATENT DOCUMENTS

| 4,148,044 | A | * | 4/1979 | Roessler ............... 365/185.1 |
| 5,349,220 | A |   | 9/1994 | Hong |
| 5,350,938 | A | * | 9/1994 | Matsukawa et al. ......... 257/378 |
| 5,594,688 | A | * | 1/1997 | Sato ..................... 365/185.12 |
| 5,617,357 | A |   | 4/1997 | Haddad et al. |
| 5,828,605 | A |   | 10/1998 | Peng et al. |
| 5,867,425 | A | * | 2/1999 | Wong .................. 365/185.08 |
| 5,872,732 | A | * | 2/1999 | Wong .................. 365/185.18 |
| 6,107,659 | A | * | 8/2000 | Onakado et al. ........... 257/318 |
| 7,133,136 | B2 | * | 11/2006 | Soskind ................. 356/454 |
| 2006/0279998 | A1 |   | 12/2006 | Forbes |
| 2007/0206424 | A1 | * | 9/2007 | Kuo et al. ............. 365/185.29 |

OTHER PUBLICATIONS

Bude, J. D., et al., "EEPROM/Flash Sub 3.0V Drain-Source Bias Hot Carrier Writing", *International Electron Devices Meeting, Technical Digest*, (Dec. 1995),989-991.

Bude, J. D., et al., "Secondary Electron Flash—a High Performance, Low Power Flash Technology for 0.35 micrometer and Below", *International Electron Devices Meeting, Technical Digest*, Held in Washington, D.C.,(Dec. 7-10, 1997),279-282.

Eitan, Boaz , et al., "NROM: A Novel Localized Trapping, 2-Bit Nonvolatile Memory Cell", *IEEE Electron Device Letters*, 21(11), (Nov. 2000),543-545.

Han, K. M., et al., "Sequential substrate and channel hot electron injection to separate oxide and interface traps in n-MOSTs", *Solid-State Electronics*, vol. 38, No. 1, (1995), 105-113.

(Continued)

*Primary Examiner*—Tan T. Nguyen
(74) *Attorney, Agent, or Firm*—Schwegman, Lundberg & Woessner, P.A.

(57) ABSTRACT

A buried bipolar junction is provided in a charge trapping transistor memory device. During a write operation electrons are injected into a surface depletion region of the memory cell transistors. These electrons are accelerated in a vertical electric field and injected over a barrier to a charge trapping dielectric layer of the memory cells.

31 Claims, 2 Drawing Sheets

OTHER PUBLICATIONS

Lusky, Eli, et al., "Characterization of Channel Hot Electron Injection by the Subthreshold of NROM Device", *IEEE Electron Device Letters*, 22(11), (Nov. 2001),556-558.

Maayan, E., et al., "A 512MB BROM Flash Data Storage: Memory with 8MB/s Data Rate", *ISSCC 2002 / Session 6 / SRAM and Non-Volatile Memories,* (Feb. 2002),4 pages.

Mahapatra, S., et al., "CHISEL Flash EEPROM—Part I: Performance and Scaling", *IEEE Transactions on Electron Devices*, vol. 49, No. 7, (Jul. 2002),1296-1301.

Mahapatra, S., et al., "CHISEL Flash EEPROM—Part II: Reliability", *IEEE Transactions on Electron Devices*, vol. 49, No. 7, (Jul. 2002), 1302-1307.

Neugroschel, Arnost, et al., "Direct-Current Measurements of Oxide and Interface Traps on Oxidized Silicon", *IEEE Transactions on Electron Devices*, vol. 42, No. 9, (Sep. 1995),1657-1662, September.

Nishida, Toshikazu, "BiMOS and SMOSC structures for MOS parameter measurement", *Solid-State Electronics*, vol. 35, No. 3, (Mar. 1992),357-369.

Sonoda, Ken'ichiro, et al., "Compact Modeling of a Flash Memory Cell Including Substrate-Bias-Dependent Hot-Electron Gate Current", *IEEE Transactions on Electron Devices*, vol. 51, No. 10, (Oct. 2004),1726-1730.

* cited by examiner

LOW POWER NROM MEMORY DEVICES

This application is a continuation of U.S. Application Ser. No. 11/151,952 filed Jun. 14, 2005 now U.S. Pat. No. 7,200,046, which is incorporated herein by reference in its entirety.

FIELD OF THE INVENTION

The present invention relates to non-volatile memory devices, and more particularly to charge trapping memory devices.

BACKGROUND

Flash memory is non-volatile, which means that it stores information on a semiconductor in a way that does not need power to maintain the information in the chip. Flash memory is based on the Floating-Gate Avalanche-Injection Metal Oxide Semiconductor (FAMOS transistor), which is essentially a Complimentary Metal Oxide Semiconductor (CMOS) Field Effect Transistor (FET) with an additional conductor suspended between the gate and source/drain terminals. Current flash memory devices are made in two forms: NOR flash and NAND flash. The names refer to the type of logic used in the storage cell array. Further, flash memory stores information in an array of transistors, called "cells," each of which traditionally stores one or more bits of information.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current is sensed and translated into 1's and 0's, reproducing the stored data.

Programming efficiency in flash memory, which is defined as a ratio of transistor gate current to programming drain-source current, is an important factor in determining power consumption in flash memories. The programming efficiency of flash memory cells, which utilize hot-electron injection, has been enhanced by applying substrate bias.

Mechanisms of hot-electron injection in a floating gate transistor during a program operation are well known. The channel hot electron (CHE) component comes from energetic channel electrons which are accelerated by lateral electric fields along a channel of the floating gate transistor. A channel initiated secondary electron (CHISEL) component comes from energetic electrons which are generated by hole impact ionization in the substrate and accelerated by vertical electric fields. As such, a gate current (Ig) by hot-electron injection in program mode can be expressed as $Ig = I_{CHE} + I_{CHISEL}$.

Known techniques for writing electrons onto the floating gate are still very inefficient. The drain current is on the order of a million times the gate current, or only about one in every millionth electron flowing down the transistor channel is injected or results in an electron being injected onto the floating gate. This requires that a high drain current be used during writing and excessive power dissipation.

A different non-volatile memory, Nitrided Read Only Memory (NROM), utilizes inherent physical features of an oxide-nitride-oxide (ONO) gate dielectric and known mechanisms of program and erase operations to create two separate physical bits per cell. The NROM cell is based on localized charge trapping. The cell is an n-channel MOSFET device where the gate dielectric is replaced by an ONO stack. Two spatially separated narrow charge distributions are stored in the nitride layer above junction edges. The NROM cell is programmed by channel hot electron injection.

A NROM or SONOS flash memory device has a charge trapping layer between a control gate (CG) and a channel of a MOSFET. Electrons are injected into the trapping layer in a program operation, whereas they are released during the erase operation. NROM memory components are gaining wide acceptance and usage in a wide variety of portable battery operated electronic equipment such as personal digital assistants, PDA's, cellular phones and cameras.

The SONOS or NROM memory devices have attracted much attention due to their advantages over the traditional floating-gate flash device, including lower programming voltage, better scalability, and improved cycling endurance. An advantage of the NROM cell is the negligible vertical retention loss due to inhibition of direct tunneling. Further, in floating gate technology the charge is stored in a conductive layer, and any minor oxide defect or oxide trapped charge under the gate might cause leakage and loss of all the stored charge. NROM technology, however, uses a nitride insulator as a retaining material, hence only a large defect in the oxide (comparable to the cell size) could degrade retention.

A BiMOS structure has been used to study the basic physical mechanisms of electron trapping in MOS gate oxides; see FIG. 1. The test structure 100 included a gate 110, a gate oxide layer 120, source 130 and drain 140. A buried bipolar emitter-base diode, regions 150 and 160, was used to inject electrons which were accelerated in a surface depletion region and injected into the gate oxide 120. Excess electrons were collected by reverse biasing the drain and/or surface regions.

There is a need for improved efficiency and reduced power consumption in programming a non-volatile memory cell.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures. The term conductor is understood to include semiconductors, and the term insulator is defined to include any material that is less electrically conductive than the materials referred to as conductors.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice as is well known in the art.

Relative terms such as above, below, lateral and adjacent are not limited to a specific coordinate system. These terms are used to describe relative positions between components and are not intended to be limitations. As such, additional components can be positioned between components that are above, below, lateral and adjacent to each other. Further, the figures are provided to help facilitate an understanding of the detailed description, are not intended to be accurate in scale, and have been simplified.

The following detailed description is, therefore, not to be taken in a limiting sense, and the scope of the present invention is defined only by the appended claims, along with the full scope of equivalents to which such claims are entitled.

Figure 1:
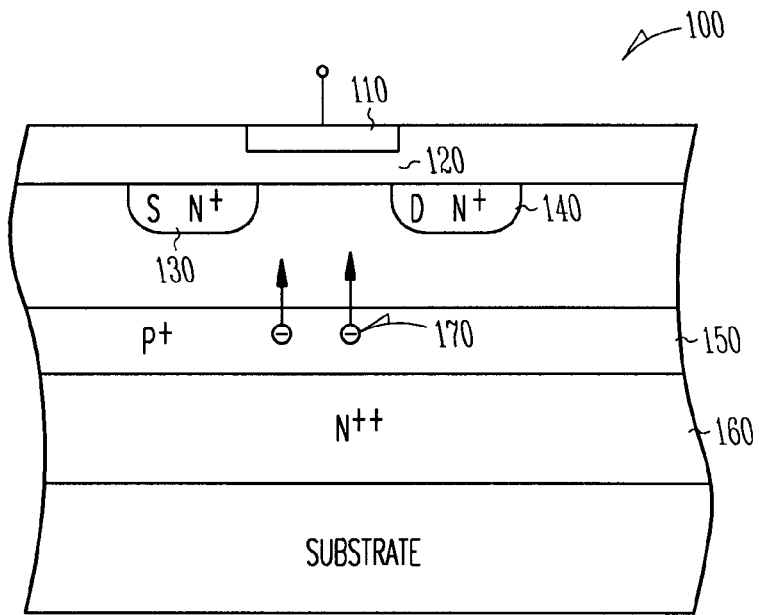
FIG. 1 illustrates a prior art test structure.
Figure 2:
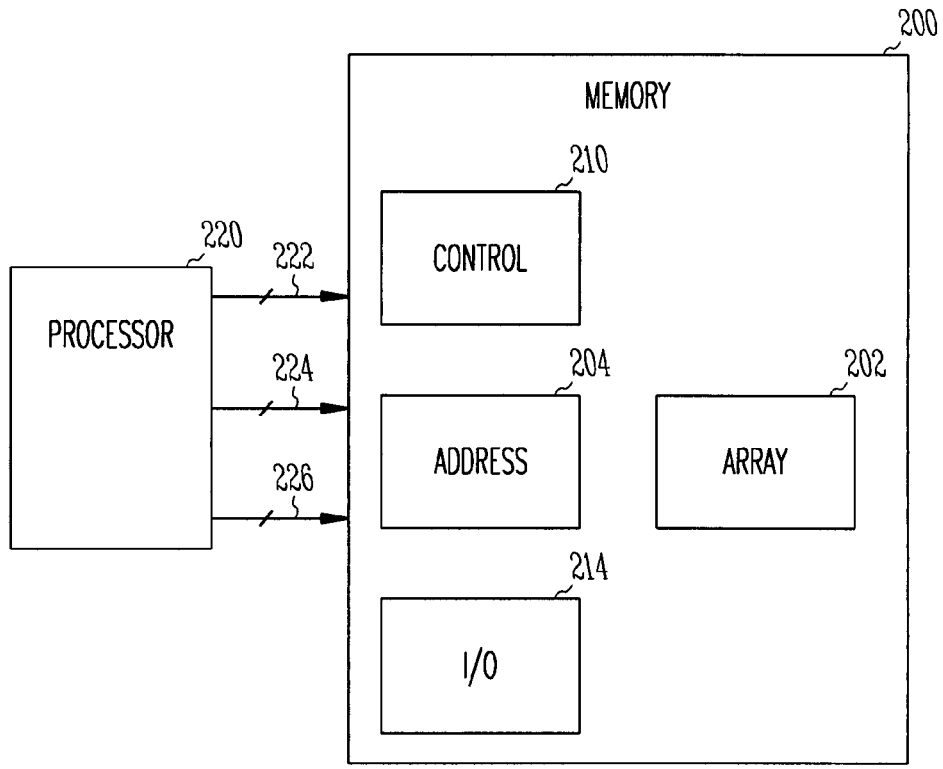
FIG. 2 is a block diagram of a memory according to one embodiment of the invention.

FIG. 2 is a simplified block diagram of an integrated circuit memory device 200 in accordance with an embodiment of the invention. The memory device 200 includes an array of non-volatile memory cells 202, address circuitry 204, control circuitry 210, and Input/Output (I/O) circuitry 214.

The memory device 200 can be coupled to a processor 220 or other memory controller for accessing the memory array 202. The memory device 200 coupled to a processor 220 forms part of an electronic system. Some examples of electronic systems include personal computers, peripheral devices, wireless devices, digital cameras, personal digital assistants (PDA's) and audio recorders.

The memory device 200 receives control signals across control lines 222 from the processor 220 to control access to the memory array 202 via control circuitry 210. Access to the memory array 202 is directed to one or more target memory cells in response to address signals received across address lines 224. Once the array is accessed in response to the control signals and the address signals, data is written to or read from the memory cells across data, DQ, lines 226.

It will be appreciated by those skilled in the art that additional circuitry and control signals can be provided, and that the memory device of FIG. 2 has been simplified to help focus on the invention. It will be understood that the above description of a memory device is intended to provide a general understanding of the memory and is not a complete description of all the elements and features of a typical memory device.

As described below, a discrete buried emitter-base junction is provided in a non-volatile memory to inject electrons into a surface depletion region of a charge trapping memory device. These electrons are accelerated in a vertical electric field and injected over a barrier to a trapping region.

Figure 3:
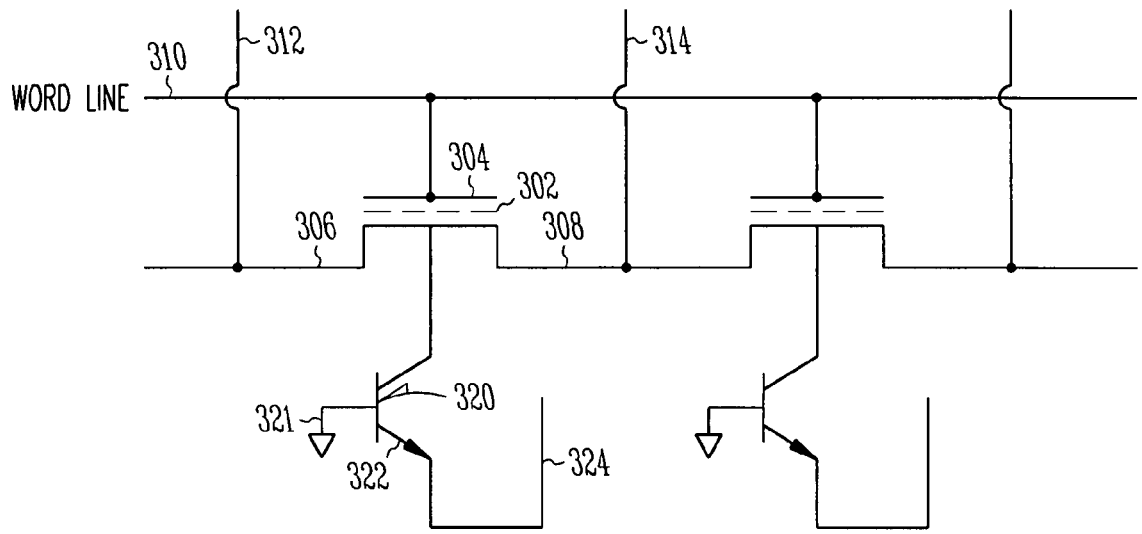
FIG. 3 is a simplified schematic diagram of a memory according to one embodiment of the invention.

FIG. 3 is a schematic diagram of a dielectric-based charge trapping memory cell of one embodiment of the invention. The memory cell has a control gate 304, source 306 and drain 308. The control gate is coupled to a word line 310. The source and drain are generally coupled to conductors 312 and 314. A gate dielectric layer of the memory cell is used to trap electrons.

In one embodiment, the memory cell is implemented in a virtual ground NOR type array as is commonly used with prior art NROM or SONOS type memory devices. This implementation allows both the source and drain regions to be reverse biased during the write operation, as explained below. In this configuration no current flows between the source and drain during the write operation. The drain and source are just used as collectors to prevent electrons from accumulating at the semiconductor surface. Unlike multi-bit NROM transistors, embodiments of the invention store a single bit of data per transistor.

The memory cell of FIG. 3 includes an NPN Bipolar transistor function 320 coupled to its substrate. A base 321 of the NPN transistor is coupled to ground and an emitter 322 is coupled to a write conductor 324 for selectively biasing the emitter. The schematic of FIG. 3 can be implemented in different integrated circuit fabrications. One example is illustrated in FIG. 4.

With an N-type buried emitter, during a write operation the base 321 is grounded, the emitter is coupled to a negative voltage, and the control gate is coupled to a positive voltage. The source and drain regions can also be biased to a positive voltage. Actual voltage levels are dependant upon the physical construction and materials used in fabricating the transistor, such as the gate dielectric and floating gate. In general, the control gate is biased to a higher positive voltage level than the source and drain.

Figure 4:
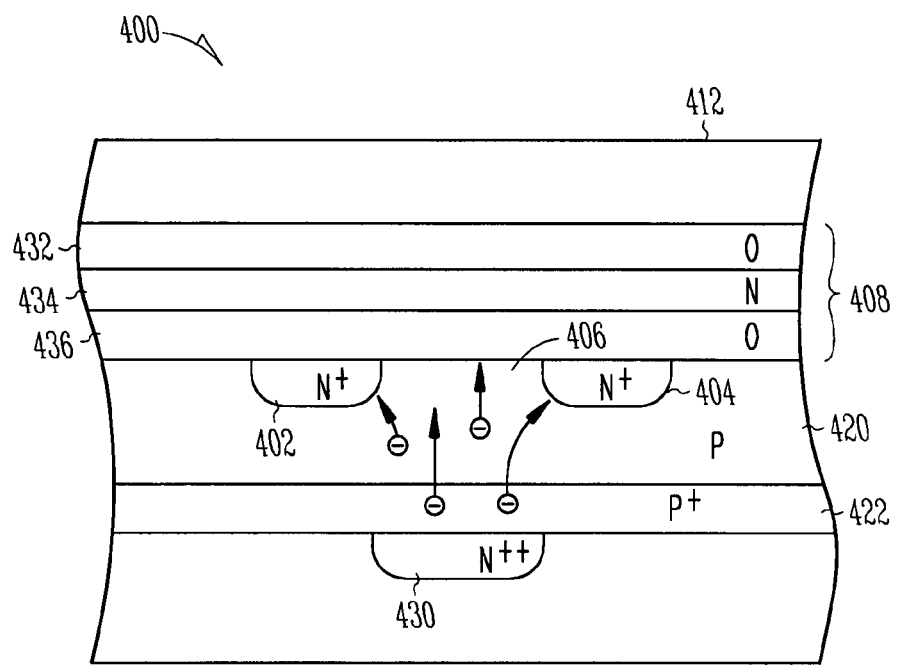
FIG. 4 is a cross-section view of a semiconductor memory according to one embodiment of the invention.

Referring to FIG. 4, a simplified cross-section of an example integrated circuit structure is described for allowing for a more efficient write operation in charge trapping memories over conventional hot electron injection write techniques. The charge trapping cell 400 in this embodiment is similar to a MOS transistor. That is, the cell includes an n-type source region 402 and an n-type drain region 404 separated to form a channel region 406. A charge trapping dielectric layer 408, such as layers of oxide-nitride-oxide (ONO) 432/434/436, separates the channel region from the control gate 412.

The source 402 and drain regions 404 are diffused into a transistor body region, such as P-type substrate 420. A P+ region 422, or layer, can be located in the p-type substrate to provide a base connection, as explained below. A buried N++ region 430 is formed in the P substrate generally vertically below the channel region 406. The buried emitter region is a discrete region. That is, it is not a complete layer under the memory array, such that less than all of the memory array cells can be selectively programmed at one time. For example, one bit or byte of memory cells can be programmed at one time. The emitter can be single diffusions under each cell, or diffusion regions under a column of cells.

The buried N++ region 430, substrate 420/422 and the source 402 (and drain 404) form an NPN transistor function. The buried emitter region 430 in one embodiment can be fabricated by using a retrograde well doping process currently used in a CMOS fabrication. In embodiments of the invention, the bipolar junction is formed in the transistor body to form a vertical electric field when biased during a write operation, such that electrons are accelerated in the vertical electric field and injected onto the floating gate.

During a memory cell program (write) operation, the buried emitter-base junction injects electrons into the surface depleted channel region of the memory device. That is, electrons injected across the p-type base region 420/422 are accelerated in a vertical electric field of the surface depleted channel region 406 and injected into the dielectric 408.

Also the write operation may be conveniently performed for all bits that share a word or address line. During programming, the sources and drains of the row are biased such that there is no source to drain current for any transistor along the word line. The programming of each particular cell along the word line is determined by the presence or absence of an electron injection from their respective emitter regions along the write data bit lines. That is, individually biasing the emitter regions of each cell along a row allows for individual cell programming.

Read and erase are accomplished using conventional NROM memory techniques. The data in the cell, or charge stored in the composite gate insulator layer, is sensed by grounding the source and applying a control gate, CG, and drain bias. That is, the conductivity of the transistor and the amount of stored charge is determined. Erase is accomplished by applying a large negative control gate voltage and tunneling electrons off of the trapping centers.

In further embodiments, the gate oxide-nitride-oxide insulator stack in the NROM cells can be replaced with atomic layer deposited (ALD) nanolaminate gate insulators, evaporated nanolaminate gate insulators, or a combination of ALD and evaporated nanolaminate gate insulators.

What is claimed is:

1. A non-volatile memory, comprising:
   source and drain regions formed in a substrate that define a channel region between the source and drain regions;
   a control gate positioned adjacent the channel region;
   a charge trapping dielectric layer positioned between the control gate and the channel region; and
   a discrete bipolar junction positioned in the substrate, the discrete bipolar junction to generate a vertical electric field that is operable, when suitably biased, to accelerate electrons in the electric field and inject the accelerated electrons into the charge trapping dielectric layer.

2. The non-volatile memory of claim 1, wherein the discrete bipolar junction comprises a buried implant region within the substrate.

3. The non-volatile memory of claim 1, wherein the charge trapping dielectric comprises layers of oxide-nitride-oxide.

4. The non-volatile memory of claim 1, wherein the charge trapping dielectric comprises nanolaminate gate insulators.

5. The non-volatile memory of claim 4, wherein the nanolarninate gate insulators include atomic layer deposition (ALD) layers.

6. The non-volatile memory of claim 1, wherein the charge trapping dielectric comprises evaporated nanolaminate gate insulators.

7. The non-volatile memory of claim 1, wherein the discrete bipolar junction comprises a region having a first conductivity that is buried in the substrate having a second conductivity that is different from the first conductivity.

8. The non-volatile memory of claim 7, wherein the first conductivity is an N-type conductivity, and the second conductivity is a P-type conductivity.

9. A non-volatile memory, comprising:
   source and drain regions formed in a substrate that define a channel region interposed between the source and drain regions, wherein the source and drain regions are doped to have a first conductivity, and the substrate is doped to have a second conductivity that is different from the first conductivity;
   a charge trapping dielectric located on a first side of the channel;
   a control gate located adjacent the charge trapping dielectric; and
   a diffused discrete buried emitter region located on a second opposing side of the channel, wherein the diffused discrete buried emitter region is doped to have the first conductivity and is configured, when suitably biased, to generate a vertical electric field to accelerate electrons in the field and inject the electrons into the charge trapping dielectric layer during a write operation.

10. The non-volatile memory of claim 9, wherein the first conductivity is an N-type conductivity and the second conductivity is P-type conductivity.

11. The non-volatile memory of claim 9, wherein the charge trapping dielectric comprises oxide layers.

12. The non-volatile memory of claim 11, wherein the charge trapping dielectric comprises a nitride layer.

13. The non-volatile memory of claim 9, wherein the charge trapping dielectric comprises nanolaminate, atomic layer deposition gate insulators.

14. The non-volatile memory of claim 9, wherein the charge trapping dielectric comprises evaporated nanolaminate gate insulators.

15. A memory device, comprising:
   an array of memory cells, wherein at least one memory cell includes a charge trapping dielectric;
   a plurality of discrete bipolar junctions located in a substrate of the array of memory cells configured to generate vertical electric fields during a write operation, such that at least some electrons accelerated in the generated vertical electric field are injected onto the charge trapping dielectric; and
   bias conductors coupled to the discrete bipolar junctions to bias the bipolar junctions to generate the vertical electric field.

16. The memory device of claim 15, wherein the bipolar junctions comprise a plurality of buried implant regions positioned adjacent a channel region of each of the charge trapping dielectrics.

17. The memory device of claim 16, wherein the buried implant regions are doped implants having a first conductivity that are positioned in substrate having a second conductivity.

18. The memory device of claim 17, wherein the first conductivity is a N-type conductivity, and the second conductivity is a P-type conductivity.

19. The memory device of claim 15, wherein the charge trapping dielectric comprises at least one nitride layer and at least two oxide layers.

20. The memory device of claim 15, wherein the charge trapping dielectric comprises nanolaminate gate insulators formed using atomic layer deposition (ALD).

21. The memory device of claim 15, wherein the charge trapping dielectric comprises evaporated nanolaminate gate insulators.

22. A method of writing data to a charge trapping transistor, comprising:
   providing a vertical electric field within a channel region of the charge trapping transistor, wherein providing an electric field within a channel region comprises biasing a discrete buried bipolar junction and a control gate of the transistor to establish the vertical electric field in the channel region of the transistor; and
   accelerating electrons in the vertical electric field to inject the electrons onto a charge trapping dielectric layer of the transistor.

23. The method of claim 22, wherein biasing a discrete buried bipolar junction and a control gate of the transistor to establish the electric field comprises biasing a biased diffusion region.

24. The method of claim 23, wherein accelerating electrons in the electric field comprises injecting the electrons into a charge trapping dielectric comprised of layers of oxide-nitride-oxide.

25. The method of claim 22, wherein accelerating electrons in the electric field comprises injecting the electrons into a charge trapping dielectric comprised of layers of a nanolaminate gate insulator formed using atomic layer deposition (ALD).

26. The method of claim 22, wherein accelerating electrons in the electric field comprises injecting the electrons into a charge trapping dielectric comprised of layers of an evaporated nanolaminate gate insulator.

27. The method of claim 24, further comprising reverse biasing a source and a drain region of the transistor to prevent current between the source and drain regions.

28. A non-volatile memory, comprising:
source and drain regions formed in a substrate that define a channel region between the source and drain regions;
a control gate positioned adjacent the channel region;
a charge trapping dielectric layer positioned between the control gate and the channel region, wherein the charge trapping dielectric layer include atomic layer deposition (ALD) insulator layers; and
a discrete bipolar junction positioned in the substrate, the discrete bipolar junction to generate an electric field that is operable, when suitably biased, to accelerate electrons in the electric field and inject the accelerated electrons into the charge trapping dielectric layer.

29. The non-volatile memory of claim 28, wherein the charge trapping dielectric layer comprises layers of oxide-nitride-oxide.

30. The non-volatile memory of claim 29, wherein the discrete bipolar junction comprises a region having a first conductivity that is buried in the substrate having a second conductivity that is different from the first conductivity.

31. The non-volatile memory of claim 30, wherein the first conductivity is an N-type conductivity, and the second conductivity is a P-type conductivity.

* * * * *

UNITED STATES PATENT AND TRADEMARK OFFICE
CERTIFICATE OF CORRECTION

PATENT NO. : 7,428,173 B2 Page 1 of 1
APPLICATION NO. : 11/707213
DATED : September 23, 2008
INVENTOR(S) : Forbes It is certified that error appears in the above-identified patent and that said Letters Patent is hereby corrected as shown below:

In column 5, line 45, in Claim 5, delete "larninate" and insert -- laminate --, therefor.

Signed and Sealed this

Twenty-fifth Day of November, 2008

JON W. DUDAS
*Director of the United States Patent and Trademark Office*